United States Patent [19]

Rast

[11] 4,218,657
[45] Aug. 19, 1980

[54] HANGUP CORRECTOR USEFUL IN LOCKED LOOP TUNING SYSTEM

[75] Inventor: Robert M. Rast, Noblesville, Ind.

[73] Assignee: RCA Corporation, New York, N.Y.

[21] Appl. No.: 904,848

[22] Filed: May 11, 1978

[51] Int. Cl.$^2$ .......................... H04B 1/26; H03B 3/06
[52] U.S. Cl. ................................... 455/182; 331/10; 331/17; 331/18; 455/260
[58] Field of Search .............................. 325/419–421, 325/453, 464, 468; 358/191, 195; 331/10, 17, 18, 25, 27, DIG. 2

[56] References Cited

U.S. PATENT DOCUMENTS

| | | | |
|---|---|---|---|
| 3,958,186 | 3/1975 | Jesse et al. | 331/25 |
| 3,971,991 | 7/1976 | Tanaka | 325/464 |
| 4,000,476 | 12/1976 | Walker et al. | 325/419 |
| 4,077,016 | 2/1978 | Sanders et al. | 331/25 |
| 4,100,503 | 7/1978 | Lindsey et al. | 331/DIG. 2 |
| 4,131,862 | 12/1978 | Black | 331/25 |

OTHER PUBLICATIONS

"A New Design Technique For Digital P.L.L. Synthesizers"–Eric Breeze Feb. 1978–IEEE Trans. on Consumer Elctronics, vol. CE 24, No. 1 pp. 24–33.

*Primary Examiner*—Marc E. Bookbinder
*Attorney, Agent, or Firm*—Paul J. Rasmussen; Allen L. Limberg; Peter M. Emanuel

[57] ABSTRACT

A phase locked loop tuning system for a television receiver includes a reference oscillator, a reference divider for dividing the frequency of the output signal of the reference oscillator, a voltage controlled local oscillator, a prescaler for dividing the frequency of the output signal of the local oscillator by a predetermined factor, a programmable divider for dividing the frequency of the output signal of the prescaler by a factor determined by the presently selected channel, a phase comparator for generating a series of pulses representing the phase and frequency relationships between the output signal of the reference divider and the output signal of the programmable divider and a low pass filter for deriving a control voltage for the local oscillator in response to the pulses generated by the phase comparator. The pulses generated by the phase comparator have polarities and widths dependent on the sense of the phase and/or frequency differences between the output signals of the reference divider and the programmable divider. A lock detector determines whether the pulses generated by the phase comparator have widths less than a first predetermined width at the end of a predetermined time. If the output signal of the prescaler has an incorrect frequency in response to a temporary malfunction of a component within the loop, the pulses generated by the phase comparator will not have widths less than the first predetermined width. In response to this occurrence, a mode switch decouples the pulses generated by the phase comparator from the low pass filter and couples pulses having a predetermined duty cycle, a predetermined repetition rate and the opposite polarity to the low pass filter instead. When the lock detector determines the first time one of its output pulses has a width less than a second predetermined width, narrower than the first, the pulses generated by the phase comparator are again coupled to the low pass filter.

10 Claims, 6 Drawing Figures

HANGUP CORRECTOR USEFUL IN LOCKED LOOP TUNING SYSTEM

BACKGROUND OF THE INVENTION

The present invention pertains to the field of closed loop systems and apparatus for inhibiting such systems from being erroneously locked up in response to temporary malfunctions of components within the loop.

Phase locked loop (PLL) systems for tuning a television receiver have recently found acceptance with television receiver manufacturers because they are capable of generating local oscillator signals having relatively accurate and stable frequencies. In addition, the frequencies of the local oscillator signals are readily programmable in response to binary signals representing channel numbers. Generally, PLL tuning systems include a reference oscillator, a reference divider for dividing the frequency of the output signal of the reference oscillator, a prescaler for dividing the frequency of the local oscillator output signal by a predetermined factor, a programmable divider for dividing the frequency of the output signal of the prescaler by a factor determined by the presently selected channel, a phase comparator for generating a series of pulses representing the phase and/or frequency deviation between the output signal of the reference divider and the output signal of the programmable divider and a low pass filter for deriving a control voltage for the local oscillator in response to the pulses generated by the phase comparator.

Unfortunately, PLL systems, because of their closed loop configurations, may become erroneously locked up in a condition corresponding to either one of the two extremes of the control voltage generated by the low pass filter due to a temporary malfunction of one of the components of the loop. For example, the control voltage may be driven to and held at one of its two extremes when amplitude of the local oscillator signal is below the counting threshold of the prescaler. In such a case the prescaler will not properly count and may, in fact, self-oscillate and thus mask the true frequency of the local oscillator signal.

While malfunction detectors for closed loop systems which detect and attempt to correct for temporary malfunctions of components within the loop are known (see, for example, U.S. Pat. No. 3,971,991—Tanaka), these detectors are not particularly well suited to PLL systems and not capable of correcting for all the possible erroneously locked up, hereinafter referred to as "hangup", conditions encountered in such systems.

SUMMARY OF THE INVENTION

A closed loop system, for example such as a phase locked loop system, includes a source of a reference frequency signal, controllable oscillator means for generating a signal having a frequency controlled in response to a control signal, and control means for generating said control signal in accordance with the magnitude and sense of at least one of the phase and frequency deviation between the controlled frequency signal and the reference frequency signal. The closed loop system also includes detector means for generating a lock signal when the deviation is less than a predetermined magnitude and correction means for coupling a correction signal, having a sense opposite to that of the control signal, to the controllable oscillator means if the lock signal is not generated by the end of a predetermined interval.

DETAILED DESCRIPTION OF THE DRAWING

Figure 1:
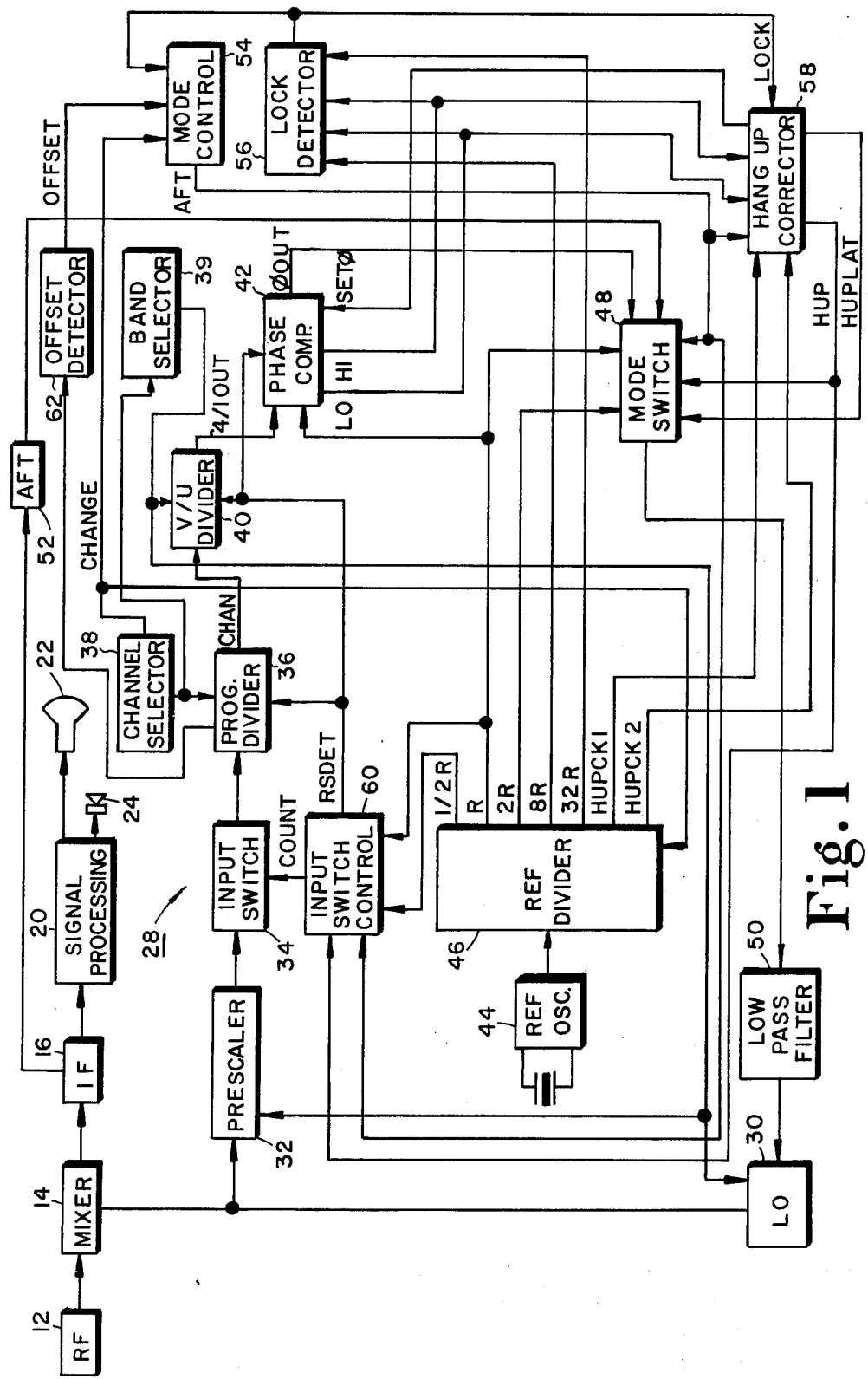
FIG. 1 shows in block diagram form a television receiver employing a phase locked loop type of television tuning system with hangup correction provisions constructed in accordance with the present invention.

In the receiver shown in FIG. 1, an RF input unit 12 filters and amplifies RF signals coupled to it. The RF signals may be coupled to RF input unit 12 from a conventional antenna network (not shown) or from a cable system (not shown). When the input to RF unit 12 is a conventional antenna system, broadcast RF carriers having standard frequencies are coupled to RF input unit 12. When the input to RF input unit 12 is a cable system, nonstandard frequency RF carriers having frequencies translated in frequency from respective standard frequency RF carriers may be coupled to RF input unit 12. For example, when a master antenna television (MATV) system is employed, the RF carriers coupled to RF input unit 12 may be translated in frequency from respective standard frequency RF carriers by as much as ±2 MHz.

The output signals of RF input unit 12 are coupled to a mixer 14 where they are combined with a local oscillator signal having a frequency appropriate for tuning the channel selected by a viewer to produce IF signals having a picture carrier at a fixed frequency, e.g., 45.75 MHz, and associated sound and color carriers. The IF signals are filtered and amplified by an IF unit 16 and coupled to a signal processing unit 20. Signal processing unit 20 derives signals representing video, color and sound information from the IF signals. In response to the signals processed by signal processing unit 20, a picture is produced by a kinescope 22 and an audio response is produced by a speaker 24.

The local oscillator signal is generated by a tuning system 28. Tuning system 28 generates local oscillator signals for tuning standard as well as nonstandard frequency RF carriers. Tuning system 28 is similar to the tuning system described in U.S. Pat. No. 4,031,549, hereby incorporated by reference.

Tuning system 28 includes a phase locked loop (PLL) comprising a voltage controlled local oscillator 30, prescaler 32, a programmable divider 36, a V/U divider 40, a phase comparator 42, a reference oscillator 44, a reference divider 46 and a low pass filter 50. Local oscillator 30 includes varactor diode arrangements for each of the television local oscillator frequency bands, e.g., in the United States, the frequency bands for channels 2-6, 7-13 and 14-83. Within each band the particular oscillation frequency of local oscillator 30 is determined by the control voltage coupled to it from low pass filter 50. Prescaler 32 divides the frequency of the local oscillator signal by a factor K selected with respect to the upper frequency limitations of programmable divider 36. For example, for channels 2-13 in the VHF range, K is equal to 64 and for channels 14-83, in the UHF range, K is equal to 256 (i.e., 4×64). An input switch 34, having a function to be described below, selectively couples the output signal of prescaler 32 to programmable divider 36. Programmable divider 36 divides the frequency of the output signal of prescaler 32 by a programmable factor N. The programmable factor N is determined by a channel selector 38 in accordance with the channel selected by a viewer. A V/U divider 40 divides the frequency of the output signal (CHAN) of programmable divider 36 by a factor of 4 when the selected channel is in the VHF range and by a factor of 1 when the selected channel is in the UHF range. The output signal of V/U divider 40 (4/1 OUT) is coupled to one input of phase comparator 42.

The band in which the selected channel resides is determined by a band selector 39. The band selector 39 is coupled to local oscillator 30 to determine which varactor diode arrangement is enabled and also to prescaler 32 and V/U divider 40 to determine their division factors.

Reference oscillator 44 is crystal controlled and therefore provides an output signal having a relatively stable frequency. The output signal of reference oscillator 44 is coupled to reference divider 46 which generates various timing signals for turning system 28. One of the timing signals generated by reference divider 46 is utilized as the reference frequency (R) signal. The reference frequency signal is coupled to a second input of phase comparator 42.

Phase comparator 42 compares the phase and frequency deviation between the signals R and 4/1 OUT and generates a series of pulses having polarities related to the sense of the phase and frequency deviation and widths related to the magnitude of the phase and frequency deviation. When 4/1 OUT has a lower frequency than R, negative-going pulses are generated by phase comparator 42. Conversely, when 4/1 OUT has a higher frequency than R, positive-going pulses are generated by phase comparator 42. The pulse output signal ($\phi$ OUT) of phase comparator 42 is coupled through a mode switch 48, having a function to be described below, to low pass filter 50. Low pass filter 50 filters the pulse signals to generate the control voltage for local oscillator 30. Low pass filter 50 contains an inverting amplifier. Thus, the control voltage increases in response to negative-going pulses and decreases in response to positive-going pulses. As the control voltage increases, the frequency of the local oscillator signal increases, and as the control voltage decreases, the frequency of the local oscillator signal decreases.

When input switch 34 and mode switch 48 are in positions such that the output signal of prescaler 32 is continuously coupled to the input of programmable divider 36 and the output of phase comparator 42 is continuously coupled to the input of low pass filter 50, tuning system 28 is said to be operating in a closed loop PLL or synthesis mode. In this mode of operation, the control voltage changes to minimize the phase and frequency deviation between R and 4/1 OUT, at which point the PLL is considered to be locked. When the PLL is locked, with the division factors set forth above, the frequency of the local oscillator signal $f_{LO}$ is related to the frequency of the reference frequency signal $f_R$ by the following expression:

$$f_{LO} = 256 N f_R$$

It is noted that if $f_R$ is made equal to 3.90625 KHz, the programmable factor N has integer values equal to the frequency in MHz of the local oscillator signals required to tune standard television RF carriers.

In order to tune a nonstandard frequency RF carrier, the output signal of an AFT (Automatic Fine Tuning) discriminator 32 representing the frequency deviation between the actual IF picture carrier and its nominal value, e.g., 45.75 MHz, due to the frequency translation of the nonstandard frequency RF carriers from the respective standard frequency RF carrier, is selectively coupled by mode switch 48 to low pass filter 50 instead of the output signal of phase comparator 42 in response to an AFT command signal generated by mode control unit 54. During this mode of operation, hereinafter referred to as the AFT mode, the frequency of the local oscillator signal is offset from the nominal value established during the synthesis mode in response to the output signal of AFT discriminator 52 to reduce the frequency deviation between the actual IF picture carrier and 45.75 MHz. However, before the synthesis mode is terminated and the AFT mode is initiated, it is necessary to determine that the local oscillator frequency is sufficiently close to its nominal frequency, i.e., that the phase and frequency deviation between R and 4/1 OUT is less than a first predetermined deviation, so as to avoid tuning the receiver to an undesired carrier such as the sound or color carrier for the selected or an adjacent carrier. A lock detector 56 accomplishes this purpose.

Lock detector 56 examines the widths of HI (HIgh local oscillator frequency) and LO (LOw local oscillator frequency) pulses generated by phase comparator 42 to control the polarity and width of the output pulses of phase comparator 42. When the widths fall below a first predetermined value determined with reference to a timing signal 8R, a LOCK signal is generated by lock detector 56. After the LOCK signal is generated, mode control 54 waits an interval during which the LOCK signal must be continuously generated, the interval being sufficiently long to ensure that the phase and frequency deviation between R and 4/1 OUT is in fact minimized. As will be described below, lock detector 56 is also utilized to determine when the PLL portion of tuning system 28 is in a "hangup" condition as earlier described and thereafter cause, in conjunction with a hangup corrector 58, the appropriate corrective action.

During the AFT mode, it is desirable to determine how far the frequency of the local oscillator signal has been driven, in response to the output signal of AFT discriminator 52, from its nominal value established during the synthesis mode to avoid tuning the system to undesired carriers. To determine how far the frequency of the local oscillator signal has been offset from its nominal value, during the AFT mode, input switch 34 decouples the output signal of prescaler 32 from the input of programmable divider 36 in response to a COUNT signal generated by an input switch control unit 60. The COUNT signal is a periodic square wave signal derived from one of two of the timing signals ($\frac{1}{2}$R and R) generated by reference divider 46 and coupled to input switch 34 in response to the AFT command signal. The count accumulated in programmable divider 36 during the positive half cycle of the COUNT signal is compared to a predetermined number, determined in accordance with the selected channel, by an offset detector 62. So that count residues do not introduce error in the frequency offset determination, a RSDET (ReSet DETector) signal is generated during the negative half cycle of the COUNT signal by input switch control 60 to reset programmable divider 36 prior to the counting interval. If the accumulated count is not within a predetermined range, an OFFSET signal is generated by offset detector 62.

In response to the OFFSET signal, mode control unit 54 terminates the AFT command signal and thereby causes the synthesis mode to be reinitiated. In addition, the value of N is increased by 1 to initiate a search for a nonstandard frequency RF carrier above the respective standard frequency RF carrier. When the PLL is locked, the AFT mode is again initiated. If a positively offset RF carrier is not located, as indicated by the generation of another OFFSET signal, the synthesis mode is reinitiated and N is decreased by 1 to initiate a search for a nonstandard frequency carrier below the respective standard frequency RF carrier. When the PLL is again locked, the AFT is again initiated.

The COUNT and RSDET signals during the AFT mode utilized to determine how far the frequency of the local oscillator signal has been driven from its nominal value are also utilized during the hangup correction mode described below.

When tuning system 28 is in the synthesis mode of operation, it is possible, as earlier noted, for the control voltage to be erroneously driven to either its upper or lower limit and then remain there placing tuning system 28 in a so-called "hangup" condition. The hangup conditions depend on the operating characteristics of local oscillator 30 and prescaler 32. It is typical of voltage controlled local oscillators which include varactor diodes that at a control voltage just below the lowest tuning voltage corresponding to the lowest channel in a particular band (e.g., channel 2 in the 2-6 band), and at a control voltage just above the highest tuning voltage corresponding to the highest channel in the band (e.g., channel 6 in the 2-6 band), the local oscillator may fail to oscillate or the amplitude of the local oscillator signal may be too low to be counted by a high speed divider such as prescaler 32. It is possible for the control voltage to exceed the normal operating range of control voltages between the lowest and highest tuning voltage because of the overshoot and ringing normally associated with the transient response of the PLL when a new channel is selected, and because while the normal operating ranges of the tuning voltage for the three television bands generally overlap, the limits of the ranges are not generally identical. Thus, when the receiver tuning is changed from a channel in one band to a channel in a second band, the tuning voltage, which was within the normal operating range in the first band, may be initially outside of the normal operating range of the second band. In addition, a high speed divider may self-oscillate when its input signal is absent or of insufficient amplitude. Keeping these undesirable characteristics of local oscillator 30 and prescaler 32 in mind, the exact nature of the various hangup conditions may be described.

When conditions are such that presclaer 32 self-oscillates, if the control voltage is below the desired control voltage for the selected channel and if the output frequency of prescaler 32 due to the self-oscillation is above the desired oscillator frequency, the control voltage will be incorrectly driven to its lower limit and held there. This low level hangup occurs because the self-oscillation frequency of prescaler 32 causes the frequency of the output signal of programmable divider 36 to be too high, with the result that the PLL incorrectly lowers the control voltage, which is already too low, to lower the frequency of the local oscillator frequency. Similarly, if the control voltage is above the desired control voltage and if the self-oscillation frequency of prescaler 32 is below the desired local oscillator frequency, the control voltage is incorrectly driven to and held at its upper limit causing the PLL to be in a high level hangup condition. Assuming that the prescaler does not self-oscillate, if the frequency of local oscillator 30 is high enough so that the amplitude of the local oscillator signal coupled to it falls below the counting threshold of prescaler 32, the output signal of prescaler 32 will have fewer cycles than it should have and the control voltage is incorrectly driven higher to raise the frequency of the local oscillator signal which is already too high. As a result, the control voltage is eventually driven to its upper limit and the PLL is in a high level hangup condition.

As earlier noted, in tuning system 28 a hangup corrector 58 is utilized in conjunction with phase comparator 42 and lock detector 56 to sense and correct a hangup situation. Briefly, when a new channel is selected (as indicated by the generation of a CHANGE signal by channel selector 38) and the synthesis mode of operation is first initiated, or when the synthesis mode of operation is reinitiated after the termination of the AFT mode of operation, after a predetermined time interval the output signal of lock detector 56 is examined to determine whether the phase and frequency deviation between the reference frequency signal R and the output signal 4/1 OUT of V/U divider 40 is below a first predetermined value. Specifically, if during a timing signal HUPCK2 (HangUP ClocK 2), which occurs at the end of a relatively long timing signal HUPCK1, lock detector 56 generates a $\overline{LOCK}$ signal, i.e., the logic complement of LOCK, indicating that the PLL is not locked, hangup corrector 58 generates a HUP (Hang UP) signal which initiates the hangup correction mode of operation.

When the PLL is in a hangup condition, the pulses generated by phase detector 42 all have the same, but incorrect, polarity. In response to the HUP signal, mode switch 48 decouples the output pulses of phase comparator 42 from the input of low pass filter 50 and couples pulses of the opposite polarity having a fixed duty cycle and repetition rate, derived from timing signals generated by reference divider 46, to the input of low pass filter 50 instead. Specifically, the HI and LO signals, generated by phase comparator 42, are coupled to hangup corrector 58, and in response to the generation of the HUP signal, are used by hangup corrector 58 to derive a signal HUPLAT (HangUP LATch) and its logic complement $\overline{HUPLAT}$, which are coupled to mode switch 48 to determine the polarity of the fixed frequency, fixed duty cycle correction pulse.

As the control voltage ramps away from the limit to which it was driven and held, the output signal of lock detector 56 is monitored to determine when the phase and frequency deviation between the reference frequency signal and the output signal of the V/U divider 40 is below a second predetermined limit. During the hangup correction mode, lock detector 56 utilizes a timing signal 32R to determine when the widths of the HI and LO signals generated by phase comparator 42 fall below a second predetermined limit. The frequency of timing signal 32R is four times greater than the frequency of timing signal 8R utilized by lock detector 56 during the synthesis mode. Therefore, when the LOCK signal is generated during the hangup correction mode, the phase and frequency deviation between the R and 4/1 OUT signals is required to be four times smaller than the phase and frequency deviation requirement between the 4/1 OUT and R signals when the LOCK signal is generated during the synthesis mode. Moreover, when the LOCK signal is generated during the hangup correction mode, the frequency of the local oscillator signal is extremely close to its correct frequency.

In response to the LOCK signal, hangup corrector 58 causes mode switch 48 to decouple the fixed duty cycle, fixed frequency correction pulses from low pass filter 50 and to again couple the output pulses of phase comparator 42 to low pass filter 50. In order to provide additional assurance that the PLL does not return to the hangup condition when hangup correction is terminated, a small phase error is introduced between the inputs of phase comparator 42 (as will be explained below) to temporarily keep the control voltage changing in the same direction it was changing during hangup correction.

During the hangup correction mode, the PLL is operating in an open loop configuration, i.e., the output pulses of phase comparator 42 are decoupled from low pass filter 50. To introduce a phase reference point so that a meaningful determination of the frequency deviation can be made with phase comparator 42 in conjunction with lock detector 56 during the hangup correction mode, the COUNT signal, which is in synchronism with the reference frequency signal R, is utilized during the hangup correction mode to periodically decouple the output signal of prescaler 32 from the input of programmable divider 36. In addition, programmable divider 36 and V/U counter 40 are reset in response to the RSDET signal, generated prior to the COUNT signal, so any count residue of these dividers does not affect the frequency deviation evaluation. To inhibit tuning system 28 from remaining in the hangup correction mode in the event of an erroneous hangup correction, which would not terminate in the manner set forth above, if the hangup correction mode is not terminated in the manner set forth above, it is terminated by the HUPCK2 timing pulse occurring next after the HUPCK2 timing pulse which initiated the hangup correction mode. In addition, after hangup correction is terminated, the output of lock detector 56 is examined at the end of the next HUPCK1 timing pulse to ensure that another hangup condition has not occurred before the AFT mode is initiated. Further, after a new channel has been selected, each time the AFT mode is terminated and the synthesis mode is reinitiated, the output of lock detector 56 is examined at the end of the HUPCK1 timing signal to determine whether hangup correction is required.

A more detailed understanding of the hangup correction mode of operation of tuning system 28 is facilitated by the following description of the implementations of various portions of tuning system 28 shown in FIGS. 2–5 which are concerned with hangup correction. For the sake of conciseness, the portions of tuning system 28 not directly concerned with hangup correction are not described in detail. However, these portions are described in detail in the aforementioned U.S. patent which has been incorporated by reference.

Figure 2:
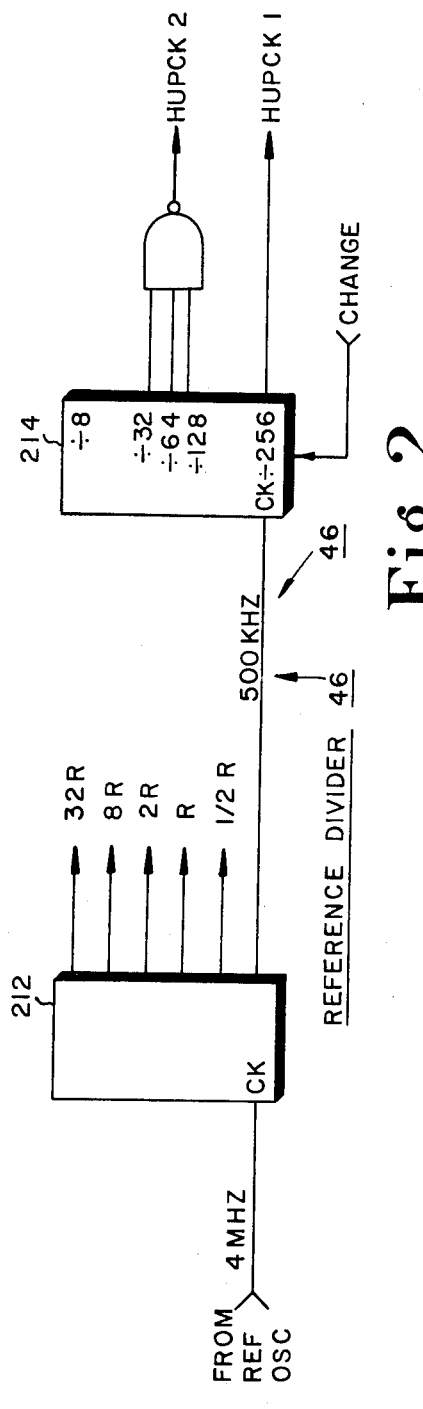
FIGS. 2-5 show, in logic diagram form, implementations of various portions of the tuning system shown in FIG. 1.

The implementation of reference divider 46 shown in FIG. 2 includes a thirteen stage binary ripple counter 212 which changes states in response to successive pulses of the output signal of reference oscillator 44.

The output signals of predetermined stages of ripple counter 212 (not shown) are combined to form the $\frac{1}{2}$R, R, 2R, 8R and 32R timing signals which are related in frequency as the numerical coefficients indicate. For example, the output signal of the tenth stage is utilized to generate the reference frequency signal R. As a result, if reference oscillator 44 has a frequency of 4 MHz, R has a frequency of 3.90625 KHz.

Reference divider 46 also includes a resettable ripple counter 214 which changes states in response to a 500 KHz output signal of ripple counter 214 (assuming that reference oscillator 44 has a frequency of 4 MHz). Ripple counter 214 is reset in response to a CHANGE signal generated by channel selector 38 when a new channel is selected. The timing signals HUPCK1 and HUPCK2 are generated from the output signals of various stages of ripple counter 214 as indicated. By means of the internal gating logic (not shown), ripple counter 214 is disabled from counting after a predetermined time (i.e., after a predetermined count is reached). The predetermined time, e.g., between 5 and 7 seconds, is selected long enough for tuning system 28 to have cycled through its complete tuning algorithm, i.e., synthesizing the nominal local oscillator frequency and switching to the AFT mode, synthesizing the nominal local oscillator frequency plus 1 MHz and switching to the AFT mode, and synthesizing the nominal local oscillator frequency minus 1 MHz and switching to the AFT mode, as previously explained. During the predetermined time in which ripple counter 214 is counting, the HUPCK1 signal is a square wave with a 512 millisecond period and the HUPCK2 signal is a series of negative-going pulses each of which have a duration of 32 milliseconds and occur at the end of each 256 millisecond half cycle of the HUPCK1 signal immediately before the next half cycle of the HUPCK1 signal.

Figure 3:
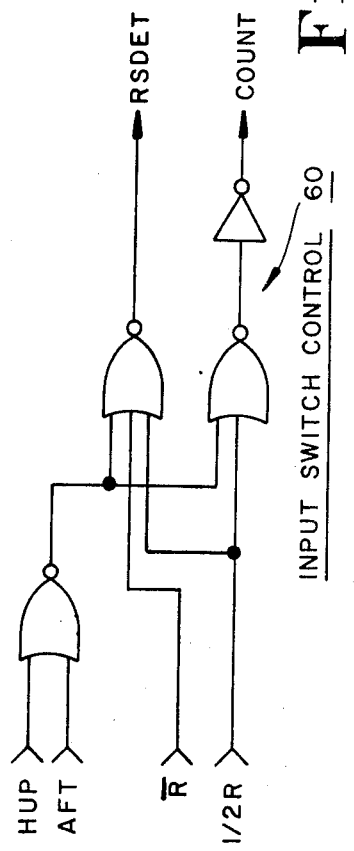
Figure 6:
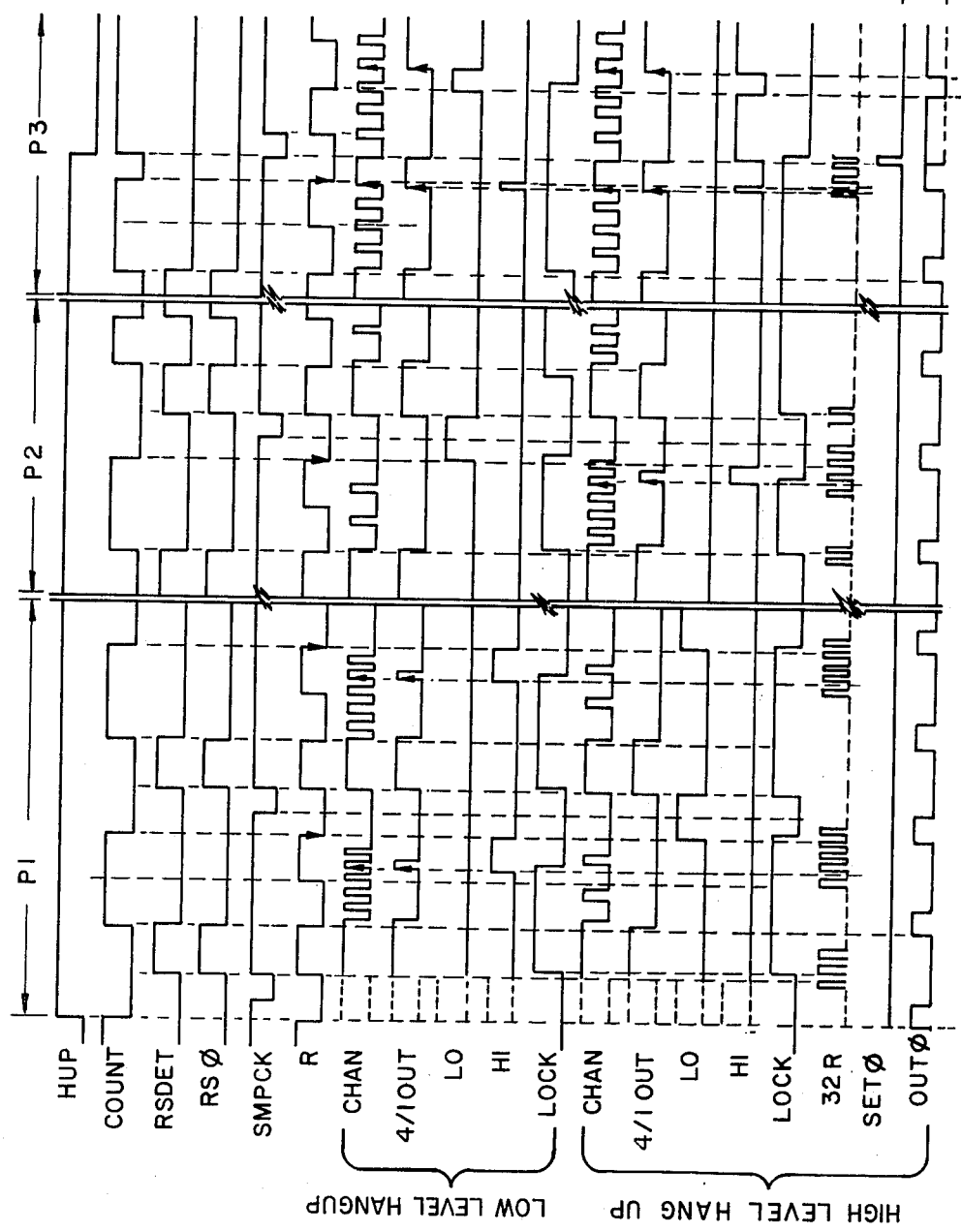
FIG. 6 shows graphical representations of various waveforms useful in facilitating the understanding of the operation of the hangup correction provisions of the tuning system shown in FIG. 1.

The implementation of input switch control unit 60 is shown in FIG. 3. The logic is arranged so that the signals COUNT and RSDET have periods and duty cycles as shown in FIG. 6. In addition, the logic is arranged so that the COUNT and RSDET signals are generated when either a HUP or an AFT signal is generated.

Figure 4:
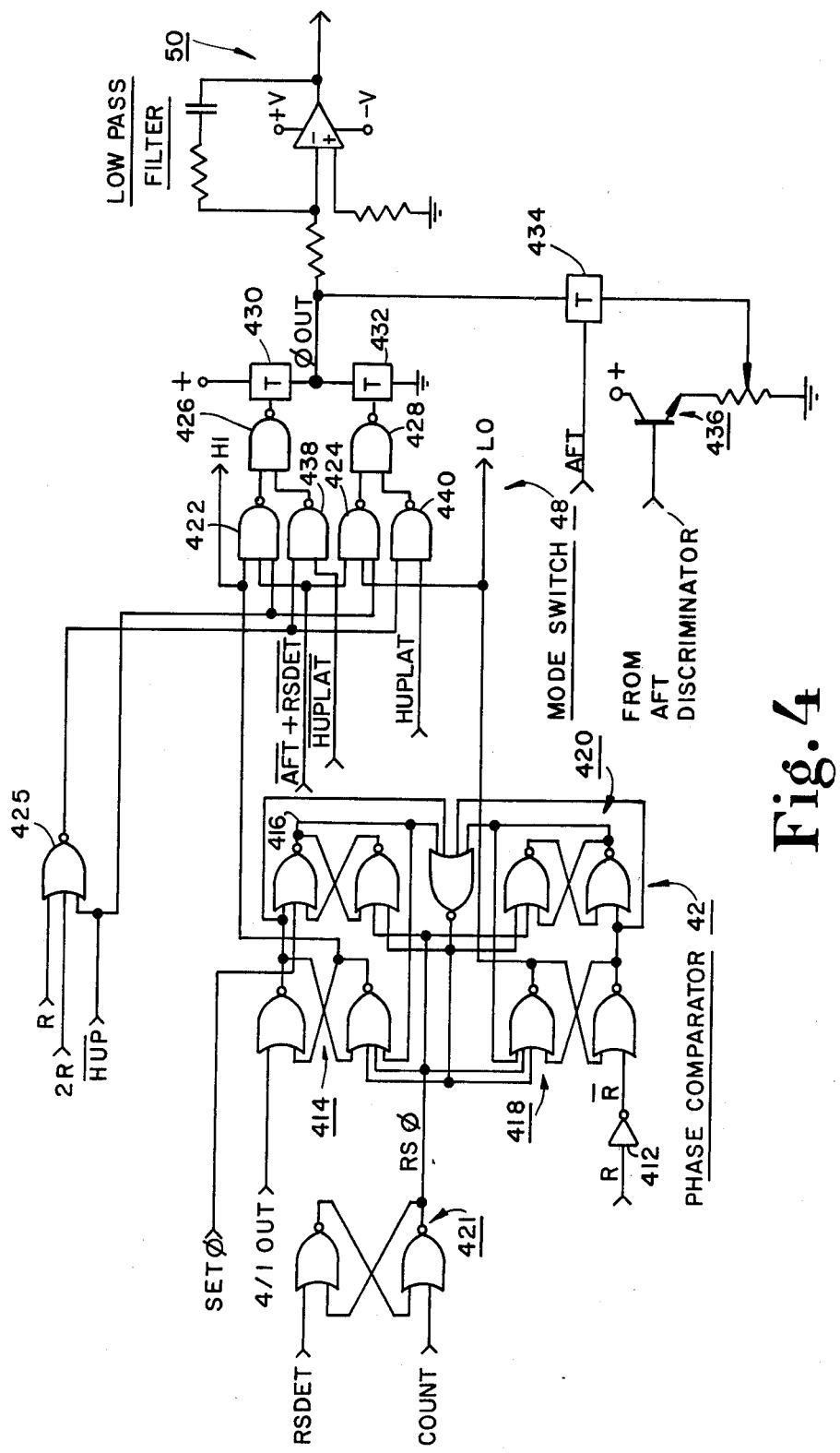

The implementation of phase comparator 42 shown in FIG. 4 is an edge-triggered memory type phase comparator similar to the "phase comparator 2" phase comparator utilized in the CD4046 integrated circuit PLL available from RCA Corporation and described in detail in "RCA Solid State '74 Data Book Series, SSD-203B, COS/MOS Digital Integrated Circuits" available from RCA Corporation, Somerville, N.J., hereby incorporated by reference. Briefly, phase comparator 42 includes two pairs of cross coupled set-reset flip-flops, 414 and 416 comprising one pair, and 418 and 420 comprising the other. Each pair is arranged in a master-slave configuration. The output signal of V/U divider 40, 4/1 OUT, is coupled to an input of flip-flop (FF) 414. The reference frequency signal R is inverted by an inverter 412 to form its complement $\overline{R}$ which, in turn, is coupled to the operative input of flip-flop (FF) 418. The output signals of phase comparator 42 are the HI and LO pulse signals.

Assuming initially that both the HI and LO signals are at their logic low (i.e., 0) levels, the first positive transition of either the $\overline{R}$ or 4/1 OUT signal causes the corresponding one of the output signals to go to a logic high (i.e., 1) level. For example, if the first positive transition occurs in the $\overline{R}$ signal, the signal LO will go to a logic 1 level; and if the first positive transition occurs in the 4/1 OUT signal, the signal HI will go to the logic 1 level. The output signal at the logic 1 level will remain there until the phase comparator is reset by a positive transition in the other input signal, at which time both output signals are caused to go to the logic 0 level. Thus, the polarity of the phase and frequency error between the two input signals of phase comparator 42 is indicated by which of its output signals is at the logic 1 level, and the magnitude of the phase and frequency error between its two input signals is indicated by the duration or pulse width of the output signal which is at the logic 1 level.

A positive going RSφ (ReSet phase comparator) signal is generated by a cross coupled set-reset FF 421 in response to the leading edges of positive-going pulses of the RSDET signal and terminated in response to the leading edge of the positive-going half cycle of the COUNT signal (see FIG. 6). The RSφ pulse is used to reset phase comparator 42 so both the HI and LO signals are at logic 0 levels at the beginning of the frequency deviation evaluation cycle during the hangup correction mode. As will be explained later, hangup corrector 58 couples a SETφ (SET phase comparator signal to phase comparator 42 under certain conditions when the hangup mode is terminated.

The implementations of mode switch 48, also shown in FIG. 4, includes six NAND gates 422, 424, 426, 428, 438 and 440, and three transmission gates 430, 432 and 434 to selectively couple either the HI or LO signals generated by phase comparator 42, the output signal of AFT discriminator 52 or the fixed frequency, fixed duty cycle hangup correction signal derived from timing signals R and 2R by a NOR gate 425 to low pass filter 50.

When tuning system 28 is in the synthesis mode, the $\overline{HUP}$ is at the logic 1 level and the AFT signal is at the logic 0 level and its complement $\overline{AFT}$ is at the logic 1 level. Correspondingly, NAND gates 438 and 440 are disabled, transmission gate 434 is nonconductive and NAND gates 422 and 424 are enabled to couple either the HI or LO pulses through NAND gates 426 and 428, which serve as negative OR gates, to transmission gates or switches 430 and 432, respectively. When HI pulses are generated by phase comparator 42, transmission gate 430 is rendered conductive thereby applying the positive-going pulses to low pass filter 50. Similarly, when LO pulses are generated by phase comparator 42 transmission gate 432 is rendered conductive thereby applying negative-going pulses to low pass filter 50. As is shown in FIG. 4, low pass filter 50 comprises an operational amplifier configured in an inverting mode. As a result, in response to positive-going pulses, it generates a control voltage which changes toward the negative supply voltage $-V$ and in response to negative-going pulses it generates a control voltage which changes toward its positive supply voltage $+V$.

When tuning system 28 is in the AFT mode, the signal $\overline{HUP}$ is at the logic 1 level, the signal AFT is at the logic 1 level and its complement $\overline{AFT}$ is at the logic 0 level. Accordingly, transmission gates 430 and 432 are both nonconductive and transmission gate 434 is conductive, thereby applying the output signal of AFT discriminator 52 through an emitter follower buffer amplifier 436 to the input of low pass filter 50.

When tuning system 28 is in a hangup correction mode, the signal $\overline{HUP}$ is at the logic 0 level, the signal AFT is at the logic 0 level and its complement $\overline{AFT}$ is at the logic 1 level. Accordingly, NAND gates 422 and 424 are disabled, transmission gate 434 is nonconductive, and a hangup correction signal having a frequency equal to the frequency of the reference frequency signal R and a duty cycle which is 25% of the duty cycle of the reference signal R is coupled to NAND gates 438 and 440. The polarity of the pulses provided to low pass filter 50 depends on which of the NAND gates 438 or 440 has been enabled. NAND gate 440 is enabled when the signal HUPLAT is at the logic 1 level and NAND gate 438 is enabled when the $\overline{HUPLAT}$ signal is at the logic 1 level.

Figure 5:
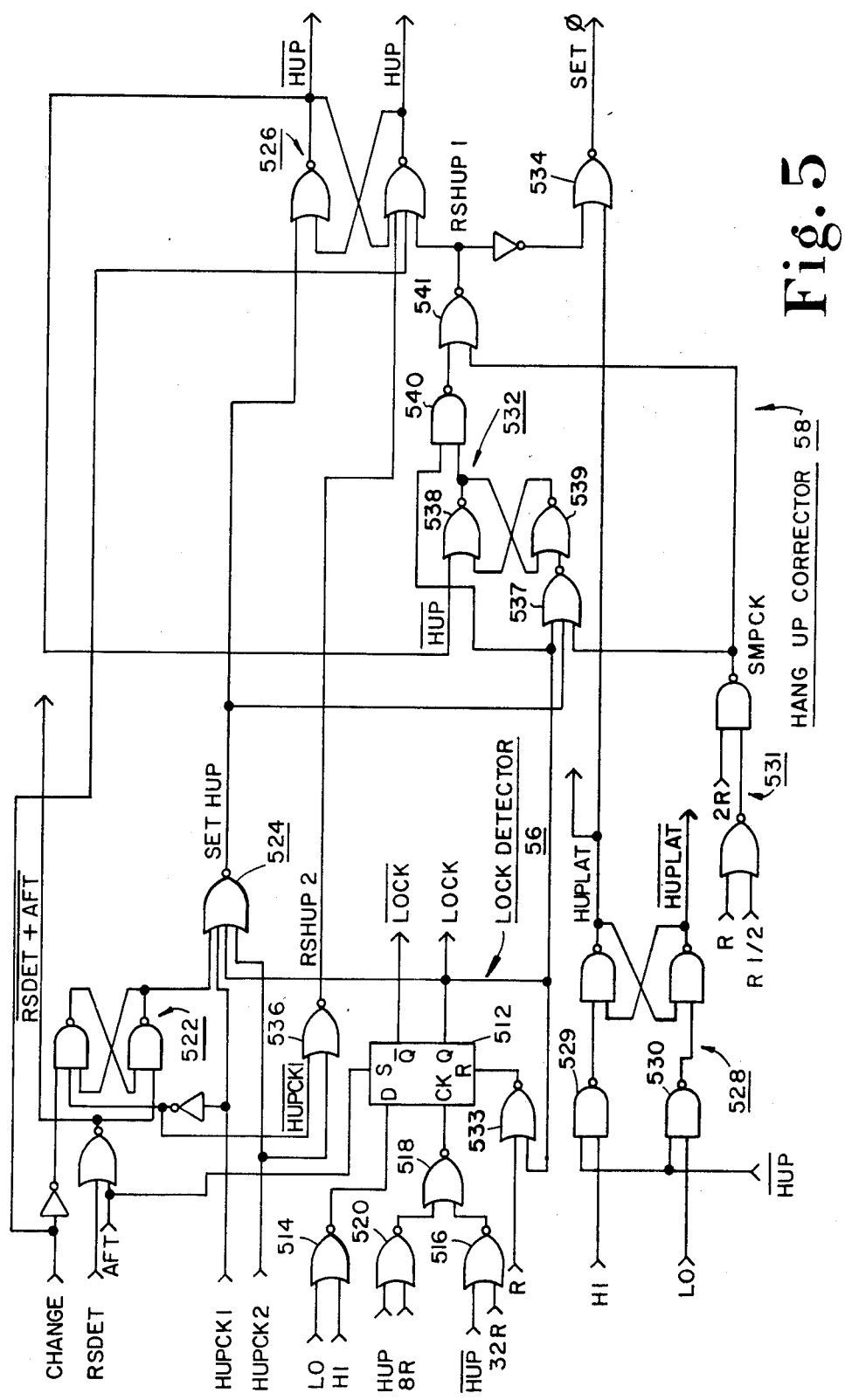

The implementation of lock detector 56 shown in FIG. 5 includes a D-type flip-flop 512. The HI and LO signals from phase comparator 42 are coupled to the D (Data) input of FF 512 through a NOR gate 514. When either of the signals HI and LO are at the logic 1 level, the logic level at the D-input is 0. Otherwise, the logic level at the D-input is 1. A selection arrangement including NOR gates 516, 518 and 520 selectively couples either the 8R or 32R timing signal to the CK (ClocK) input of FF 512 in response to the HUP and $\overline{HUP}$ signals. When tuning system 28 is in the synthesis mode, the signal HUP is at the logic 0 level and its complement $\overline{HUP}$ is at the logic 1 level. The converse is true in the hangup correction mode. Consequently, during the synthesis mode, the 8R timing signal is coupled to the CK input of flip-flop 512 and during the hangup correction mode, the 32R timing signal is coupled to the CK input of flip-flop 512. On each positive transition of the signal coupled to the CK input of flip-flop 512 the logic level at the D-input of FF 512 is transferred to the Q output of FF 512 where the signal LOCK is generated. If the HI and LO pulses are narrower than the interval between positive transitions of the signal applied to the CK input, the logic 0 level signal developed at the D-input of FF 512 in response to either HI or LO pulses will occur between positive-going transitions of the signal applied to the CK input of FF 512 and the Q input will remain at a logic 1 state. Thus, as earlier noted, a LOCK signal is generated when the HI and LO pulses generated by phase comparator 42 have widths less than a first predetermined width determined by the frequency of the 8R timing signal in the synthesis mode and less than a second predetermined width determined by the frequency of the 32R timing signal in the hangup correction mode.

The implementation of hangup corrector 58, also shown in FIG. 5, includes a cross coupled set-reset FF 522 which delays the examination of the Q output signal of FF 512 of lock detector 56 after the generation of a CHANGE or $\overline{AFT}$ signal until the occurrence of the negative-going HUPCK2 pulse just before the positive-going half cycle of the HUPCK1, i.e., a period of $256-32=224$ milliseconds. During the negative-going HUPCK2 pulse, which lasts for 32 milliseconds, if the LOCK signal does not remain at the logic 1 level, a NOR gate 524 generates a positive-going SETHUP (SET HangUP) corrector signal which in turn causes a cross coupled FF 526 to be set so that the HUP signal, generated at its set output, is at the logic 1 level.

In response to the HUP signal, as earlier noted, the 8R timing signal is decoupled from the CK input of FF 512 and the 32R timing signal is coupled there instead. In addition, in response to the logic 0 level of the $\overline{HUP}$ signal, the logic complement of HUP, the HI and LO signals are disabled from reaching the inputs of a cross coupled set-reset FF 528 through NAND gates 529 and 530, respectively. FF 528 is utilized to generate the HUPLAT and $\overline{\text{HUPLAT}}$ signals. If phase comparator 42 is generating HI pulses when HUP is generated, thereby erroneously decreasing the control voltage, the HUPLAT signal is set to the logic 1 level. If phase comparator 42 is generating LO pulses when HUP is generated, thereby erroneously decreasing the local oscillator frequency, the signal $\overline{\text{HUPLAT}}$ is set to the logic 1 level. As earlier noted, when the HUPLAT is at the logic 1 level, the fixed frequency, fixed duty cycle hangup correction signal is caused to have negative-going pulses which increase the control voltage. Conversely, when the $\overline{\text{HUPLAT}}$ is at the logic 1 level, the hangup correction signal is caused to have positive-going pulses which decrease the control voltage. Thus, in response to the generation of the HUP signal, the control voltage is driven at a predetermined rate in the direction opposite to the direction in which it was driven during the hangup condition. The rate, determined by the duty cycle of the correction pulses, is selected to bring the frequency of the local oscillator signal in a relatively short time to the correct frequency but to minimize the overshoot when the correct frequency is reached and hangup correction is terminated.

To better understand the remaining part of the implementation of hangup corrector 58 shown in FIG. 5, concurrent reference should be made to FIG. 6, which graphically represents various waveforms involved in hangup correction of both a low level hangup and a high level hangup. The waveforms shown in FIG. 6 begin at a time when the hangup HUP signal is generated.

As earlier noted, when the HUP signal goes to a logic 1 level, the generation of the COUNT and RSDET signals are enabled by input switch control unit 60. The RSDET is utilized to reset programmable counter 36, V/U divider 40 and phase comparator 42 during the negative half cycle of the COUNT signal when the output signal of prescaler 32 is decoupled from the input of programmable divider 36, but just prior to the positive half cycle of the COUNT signal. During the positive half cycle of the COUNT signal, the output of prescaler 32 is again coupled to the input of programmable divider 36. In addition, after the generation of the HUP signal, the output of the lock detector 56 is periodically examined in response to a periodic timing signal SMPCK (SaMPle ClocK) generated by a logic network 531 to determine when hangup correction should be terminated.

In the low level hangup condition illustrated in FIG. 6, the control voltage has been driven below the lowest sustaining voltage of the local oscillator 30 and prescaler 32 oscillates at a frequency which is above the desired frequency. Just after the initiation of the HUP signal, in an interval P1, there has been insufficient time for the hangup corrector to correct this condition. The condition is manifested by the CHAN signal during the positive half cycle of the COUNT signal. If the PLL were not hung up, four CHAN pulses would be generated during the positive half cycle of the COUNT signal. Correspondingly, there would be one 4/1 OUT pulse generated during the positive half cycle of the COUNT signal. However, when a low level hangup condition occurs, as illustrated, more than four CHAN pulses are generated during the positive half cycle of the COUNT signal and as a result 4/1 OUT pulse is out of phase with the negative-going edge (indicated by an arrow) of the R signal. This causes a relatively wide HI to be generated which starts at the positive-going edge of the 4/1 OUT pulse and terminates at the negative-going edge of the R pulse. In response to the generation of the HI pulse, the LOCK signal falls to the logic 0 level. Because the HI remains at the logic 1 level for each clock pulse applied to the CK input of D-FF 512 during the remainder of the positive half cycle of the COUNT signal, the LOCK signal has a logic 0 level during the remainder of the positive half cycle of the COUNT signal. It will be noted that at the termination of the positive half cycle of the COUNT signal the HI signal falls to the logic 0 level. However, the LOCK signal does not rise to the logic 1 level because the R signal is used to enable NOR gate 533 which latches the D-FF 512 into the condition in which it has been set during the positive half cycle of the COUNT signal, in this case the logic 0 level. Thus, when the SMPCK pulse occurs during the next quarter cycle after the positive half cycle of the COUNT signal, the LOCK signal is still at the logic 0 level and tuning system 28 remains in the hangup correction mode.

Eventually, the correction pulse causes the control voltage to rise to a point at which local oscillator 30 begins to oscillate. This is indicated during the interval P2 of FIG. 6. Here it will be noted that the frequency of local oscillator 30 begins to change and the self-oscillation frequency of prescaler 32 no longer masks the true frequency of local oscillator 30. At this point, the frequency of local oscillator 30 is low and less than four CHAN pulses are generated during the positive half cycle of the COUNT signal.

Finally, in period P3 of FIG. 6, the local oscillator frequency is essentially correct and four CHAN pulses are generated during the positive half cycle of the COUNT signal. This means that just prior to the termination of the positive half cycle of the COUNT signal the 4/1 OUT signal rises. At this point the frequency of the local oscillator signal is just slightly higher than it should be and the leading edge of the 4/1 OUT pulse occurs just slightly ahead of the negative-going edge of the R pulse. The phase comparator detects this and generates a relatively narrow HI pulse.

Since the rising edges of pulses that are coupled to the CK input D-FF 512 occur on both sides of the narrow HI pulse but do not occur during its duration, the LOCK signal remains at the logic 1 level through the interval when the next SMPCK pulse occurs. In response, logic arrangement 532 causes the generation of a RSHUP1 (ReSet HangUP corrector 1) which in turn causes FF 526 to reset the HUP signal to the logic 0 level and the hangup correction mode is terminated.

When the HUP signal falls to the logic 0 level, the COUNT signal rises to the logic 1 level thereby continuously coupling the output signal of prescaler 32 to the input of programmable divider 36. However, because there is some delay before dividers 36 and 40 begin to count, the first CHAN pulse does not occur immediately. As a result, the falling edge of the R pulse is to be slightly ahead of the rising edge of the 4/1 OUT pulse. In other words, it appears to the phase comparator 42 as if the local oscillator frequency is slightly low. In response, phase comparator 42 generates LO pulses, which are coupled through mode switch 48 as φ OUT, which cause the control voltage to increase for a short time after the synthesis mode is reinitiated. Since the hangup condition corrected was a low level hangup condition, this ensures that the system will not revert to a low level hangup condition.

During the high level hangup condition illustrated in FIG. 6, the control voltage has been driven and held at a level at which the output pulses of local oscillator 30 are attenuated and therefore not counted. This is illustrated by the fact that during the positive half cycle of the COUNT signal in the first interval P1 of hangup correction, less than four CHAN pulses are generated and no 4/1 OUT pulses are generated. As a result, a relatively wide LO pulse starting with the negative-going edge of the R pulse and ending with the positive-going edge of the RSDET pulse is generated. In response to this relatively wide LO pulse, the LOCK signal is at the logic 0 level when the SMPCK pulse occurs.

In period P2, because of the action of hangup corrector 58, the frequency of the local oscillator signal has been decreased to a point where the pulses of the local oscillator signal have sufficient amplitude to be counted. At this point, the frequency of the local oscillator signal is relatively high and more than four CHAN pulses occur during the positive half cycle of the COUNT signal. Therefore, at least one 4/1 OUT pulse will be generated during the positive half cycle of the COUNT signal. Accordingly, a relatively wide HI pulse is generated causing the lock signal to be at the logic 0 level when the SMPCK pulse occurs.

Eventually, in period P3, as the frequency of the local oscillator signal decreases, the HI pulse will become so narrow that the LOCK signal will be at a logic 1 level when the SMPCK pulse occurs. At this point, hangup correction is terminated. In this, it is noted, the frequency of the local oscillator is slightly higher than the correct frequency.

When the hangup correction is terminated, as in the low level hangup situation, during the delay between the fall of the COUNT signal and the SMPCK pulse, neither programmable divider 36 nor V/U divider 40 count. Because of this delay the falling edge of the R signal is slightly ahead of the 4/1 OUT signal thereby providing an apparent indication that the local oscillator frequency is too low. As a result, when the synthesis mode is reinitiated, the control voltage may be driven back toward the high level hangup level. To prevent a second high level hangup, a positive-going SET$\phi$ is generated by a NOR gate 534 when the RSHUP1 and HUPLAT signals rise to the logic 1 level. The SET$\phi$ signal is utilized to set phase comparator 42 such that it temporarily generates a relatively wide HI pulse after hangup correction is terminated. As a result, the control voltage continues to be driven lower for a short period after the high level hangup correction is terminated.

If hangup correction is not terminated in the aforesaid manner, at the occurrence of the next HUPCK2 pulse, a RSHUP2 pulse is generated by NOR gate 536 which causes the termination of the hangup correction mode as previously noted.

Logic arrangement 532 imposes two requirements which must be met in sequence to result in the generation of RSHUP1, and thus terminate the hangup correction. First, a SMPCK pulse must have occurred during which LOCK was at a logic 0 level, and second, that following the first requirement a SMPCK pulse must have occurred for which LOCK was at a logic 1 level. The first condition serves to ensure that a premature hangup reset does not occur during the initiation of hangup correction. NOR gate 537 decodes the first requirement and sets a set-reset flip-flop consisting of NOR gates 538 and 539 to store this information. NAND gate 540 and NOR gate 541 decode the second condition and generate RSHUP1.

In the example cited above, the hangup correction was reset as the tuning voltage became arbitrarily close to the desired tuning voltage. It is also possible for the reset to occur as the tuning voltage crosses the threshold at which the local oscillator 30 begins to operate properly and prescaler 32 begins to properly count the local oscillator output. Since the timing of crossing this threshold occurs asynchronously with respect to the hangup corrector 58 timing, a COUNT cycle can occur during which programmable divider 36 counts a composite of erroneous prescaler output cycles and correct prescaler output cycles. This composite count may result in LOCK being a logic 1 level during the SMPCK pulse and thus causing a premature RSHUP1. The introduction of a deliberate phase error between 4/1 OUT and R to cause the tuning voltage to continue to drive in a direction away from the hangup level and towards the desired tuning voltage ensures that the threshold region will be safely crossed and that the system will not revert back into hangup.

It is typical in a PLL that the tuning voltage "rings" as it settles to its desired value, i.e., that the transient response of the tuning voltage consists of a series of overshoots above and below the desired value, with each successive overshoot being of a lesser amplitude. If the tuning voltage threshold for proper operation of the local oscillator 30 is sufficiently close to the desired tuning voltage, it is possible for an overshoot, as the voltage settles after resetting of the hangup correction, to cross the threshold and cause the system to lapse back into the hangup condition. The resetting of the hangup correction with a deliberate phase error introduced between 4/1 OUT and R so as to cause the tuning voltage to drive away from the hangup level ensures that the initial overshoot will be in a direction away from the local oscillator 30 malfunction voltage threshold, and since the initial overshoot is the largest, minimizes the possibility that the system will lapse back into hangup.

What is claimed is:

1. Apparatus comprising:
   a source of a reference frequency signal;
   controllable oscillator means for generating a signal having a frequency controlled in response to a control signal;
   control means for generating said control signal in response to the magnitude and the sense of at least one of the phase and frequency deviation between said controlled frequency signal and said reference frequency signal;
   detector means for generating a lock signal when said deviation is less than a predetermined magnitude, said deviation being normally reduced to said predetermined magnitude no later than the end of a predetermined time interval after the initiation of the operation of said apparatus;
   timing means for generating a timing signal having a duration corresponding to said predetermined time interval; and
   correction means to which said timing means and said detector means are coupled for coupling a correction signal to said controllable oscillator means at the end of said timing signal in the absence of said lock signal, said correction means including sense means for detecting the sense of change of said control signal at the end of said timing signal, said correction signal having a sense of change opposite to that of said control signal at the end of said timing signal so that said deviation is reduced.

2. The apparatus recited in claim 1 wherein:
said correction means initially couples said control signal to said controllable oscillator means, couples said correction signal to said controllable oscillator means when said lock signal is not generated by the end of said predetermined time interval, and again couples said control signal to said controllable oscillator means when said lock signal is generated.

3. The apparatus recited in claim 2 wherein:
said correction means includes means for periodically establishing a predetermined phase relationship between said controlled frequency signal and said reference frequency signal when said correction signal is coupled to said controllable oscillator means.

4. The apparatus recited in claim 3 wherein:
said correction means includes means for temporarily causing the sense of said control signal to have the same sense as said correction signal when said control signal is again coupled to said controllable oscillator means after the generation of said lock signal.

5. The apparatus recited in claim 4 wherein:
said detector means generates said lock signal when said deviation is less than a first predetermined magnitude when said control signal is coupled to said controllable oscillator means and generates said lock signal when said deviation is less than a second predetermined magnitude which is less than said first predetermined magnitude when said correction signal is coupled to said controllable oscillator means.

6. The apparatus recited in claim 2 wherein:
said correction means again couples said correction signal to said controllable oscillator means when said lock signal is not generated at the end of a second predetermined time interval after said first-mentioned predetermined time interval.

7. The apparatus recited in claim 3 wherein:
said controllable oscillator means includes local oscillator means for generating a local oscillator signal for tuning a receiver to an RF carrier associated with a selected channel in response to said control signal, prescaler means for dividing the frequency of said local oscillator signal by at least one predetermined factor, and programmable divider means for dividing the frequency of the output signal of said prescaler means by a programmable factor determined by said selected channel number, said controlled frequency signal being derived from the output signal of said programmable divider.

8. The apparatus recited in claim 7 wherein:
said controllable oscillator means includes mixer means for combining said local oscillator signal with said RF carrier to derive an IF signal having an information bearing carrier having a nominal frequency associated therewith, discriminator means for generating a discriminator signal representing the frequency deviation between said information bearing carrier and said nominal frequency, and mode switch means for coupling said discriminator signal to said local oscillator means in response to said lock signal and for coupling said correction signal to said controllable oscillator means when said lock signal is not generated by the end of said predetermined time interval.

9. The apparatus recited in claim 8 wherein:
said controllable oscillator means includes input means coupled to at least one of said local oscillator means, said prescaler means and said programmable divider means for selectively inhibiting the generation of said controlled frequency signal in response to a predetermined portion of a count signal derived in response to said reference frequency signal, said count signal being generated when one of said correction signal and said discriminator signal is coupled to said local oscillator means; and offset means for generating an offset signal when said discriminator signal is coupled to said local oscillator means when the number of cycles of the output signal of said prescaler means occurring during said predetermined portion of said count signal differs from the number of cycles of the output signal of said prescaler means occurring during a corresponding time interval when said control signal is coupled to said local oscillator means by a predetermined count, said control signal being again coupled to said local oscillator means in response to said offset signal.

10. Apparatus comprising:
a source of reference frequency signal;
controllable oscillator means for generating a signal having a frequency controlled in response to a control signal;
control means for generating said control signal in response to the magnitude and the sense of at least one of the phase and frequency deviation between said controlled frequency signal and said reference frequency signal, said control means including means for generating an error signal comprising a series of pulses, each of said pulses having a polarity determined by the sense of said deviation and a width determined by the magnitude of said deviation, and low pass filter means for generating said control signal in response to said error signal;
detector means for generating a lock signal when the width of said pulses of said error signal is less than a predetermined width, the width of said pulses of said error signal being normally reduced to said predetermined width no later than the end of a predetermined time interval after the initiation of the operation of said apparatus;
timing means for generating a timing signal having a duration corresponding to said predetermined time internal; and
correction means to which said timing means and said detector means are coupled, for coupling a correction signal to said low pass filter means at the end of said timing signal in the absence of said lock signal, said correction means including sense means for detecting the polarity of the pulses of said error signal at the end of said timing signal, said correction signal including a series of pulses having a predetermined width and a polarity opposite to the polarity of the pulses of said error signal at the end of said timing signal so that said deviation is reduced.

* * * * *